United States Patent
Park et al.

(10) Patent No.: US 9,857,678 B1
(45) Date of Patent: Jan. 2, 2018

(54) METHODS OF CONTROLLING DISTORTION OF EXPOSURE PROCESSES

(71) Applicant: SK hynix Inc., Gyeonggi-do (KR)

(72) Inventors: Chan Ha Park, Gyeonggi-do (KR); Shin Young Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/408,834

(22) Filed: Jan. 18, 2017

(30) Foreign Application Priority Data

Aug. 31, 2016 (KR) .................... 10-2016-0112056

(51) Int. Cl.
| | |
|---|---|
| *G03F 1/72* | (2012.01) |
| *G03F 7/038* | (2006.01) |
| *G03F 1/70* | (2012.01) |
| *G03F 1/42* | (2012.01) |
| *G03F 7/16* | (2006.01) |
| *G03F 7/20* | (2006.01) |
| *G03F 1/44* | (2012.01) |
| *G03F 7/26* | (2006.01) |
| *H01L 27/108* | (2006.01) |
| *G03F 7/039* | (2006.01) |
| *H01L 21/308* | (2006.01) |

(52) U.S. Cl.
CPC .............. *G03F 1/72* (2013.01); *G03F 1/42* (2013.01); *G03F 1/44* (2013.01); *G03F 1/70* (2013.01); *G03F 7/038* (2013.01); *G03F 7/039* (2013.01); *G03F 7/16* (2013.01); *G03F 7/2022* (2013.01); *G03F 7/26* (2013.01); *H01L 21/3086* (2013.01); *H01L 27/10844* (2013.01)

(58) Field of Classification Search
None
See application file for complete search history.

(56) References Cited

U.S. PATENT DOCUMENTS

| 9,502,136 B1 * | 11/2016 | Kim ................. G11C 29/12 |
| 2008/0164894 A1 * | 7/2008 | Kim ................. G01R 31/2886 324/754.08 |
| 2009/0138768 A1 * | 5/2009 | Pyeon ................ G11C 29/02 714/715 |

(Continued)

FOREIGN PATENT DOCUMENTS

KR 1020040021594 3/2004

OTHER PUBLICATIONS

Kang, Y. et al.,Solution for high-order distortion on extreme illumination condition using computational prediction method, 2015, Proc. of SPIE vol. 9426.

*Primary Examiner* — Bilkis Jahan
(74) *Attorney, Agent, or Firm* — IP & T Group LLP

(57) ABSTRACT

A method of controlling distortion of an exposure process is provided. The method includes aligning an exposure mask with a wafer, forming a first test pattern on the wafer by performing a first exposure with the exposure mask and a first illumination system, forming a photoresist layer on an entire surface of the wafer including the first test pattern, performing a second exposure with the exposure mask and a second illumination system to form a second test pattern overlapping with the first test pattern, extracting a distortion value between the first test pattern and the second test pattern, and correcting the exposure mask or fabricating a corrected exposure mask using the distortion value.

20 Claims, 21 Drawing Sheets

(56) References Cited

U.S. PATENT DOCUMENTS

2011/0004793 A1\* 1/2011 Sul .................. G11C 29/003
  714/718
2014/0006863 A1\* 1/2014 Yang ................. G11C 29/10
  714/30

\* cited by examiner

METHODS OF CONTROLLING DISTORTION OF EXPOSURE PROCESSES

CROSS-REFERENCE TO RELATED APPLICATIONS

The present application claims priority under 35 U.S.C 119(a) to Korean Application No. 10-2016-0112056, filed on Aug. 31, 2016, which is incorporated herein by references in its entirety.

BACKGROUND

1. Technical Field

Various embodiments of the present disclosure relate generally to methods of evaluating exposure processes used in fabrication of semiconductor devices and, more particularly, to a method of controlling distortion of an exposure process.

2. Related Art

In the fabrication of semiconductor devices, a lithography process is typically performed for transferring images generated from patterns of a reticle onto a wafer. The lithography process may typically include coating a photoresist material on the wafer to form a photoresist layer, selectively exposing portions of the photoresist layer to a light passing through the reticle loaded into an exposure equipment, and developing the photoresist layer to selectively remove the exposed portions or the non-exposed portions of the photoresist layer. Circuit patterns of the semiconductor device may thus be realized on the wafer using the aforementioned exposure and development steps.

In the lithography process, an overlay margin between a first circuit pattern and a second circuit pattern aligned with the first circuit pattern has to be very accurately controlled to increase the fabrication yield of the semiconductor devices. The overlay margin refers to an alignment margin between two different layers which are stacked on the wafer. As semiconductor devices become more highly integrated, it has become increasingly more important to accurately and reliably control the overlay margin.

SUMMARY

Various embodiments are directed to an improved exposure method. The method provides for improved control of distortion of the exposure process.

In an embodiment, a method of controlling distortion of an exposure process may include: aligning an exposure mask with a wafer, forming a first test pattern on the wafer using a first exposure process with the exposure mask and a first illumination system, forming a photoresist layer on an entire surface of the wafer including the first test pattern, performing a second exposure process with the exposure mask and a second illumination system to form a second test pattern overlapping with the first test pattern, extracting a distortion value between the first test pattern and the second test pattern, and correcting the exposure mask or fabricating a corrected exposure mask using the distortion value. The exposure mask includes at least one first image pattern, at least one overlay image outer mark, at least one second image pattern having a feature different from the least one first image pattern, and at least one overlay image inner mark. The second image pattern and the overlay image inner mark of the exposure mask are transferred to the photoresist layer to overlap with the first test pattern during the second exposure process.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
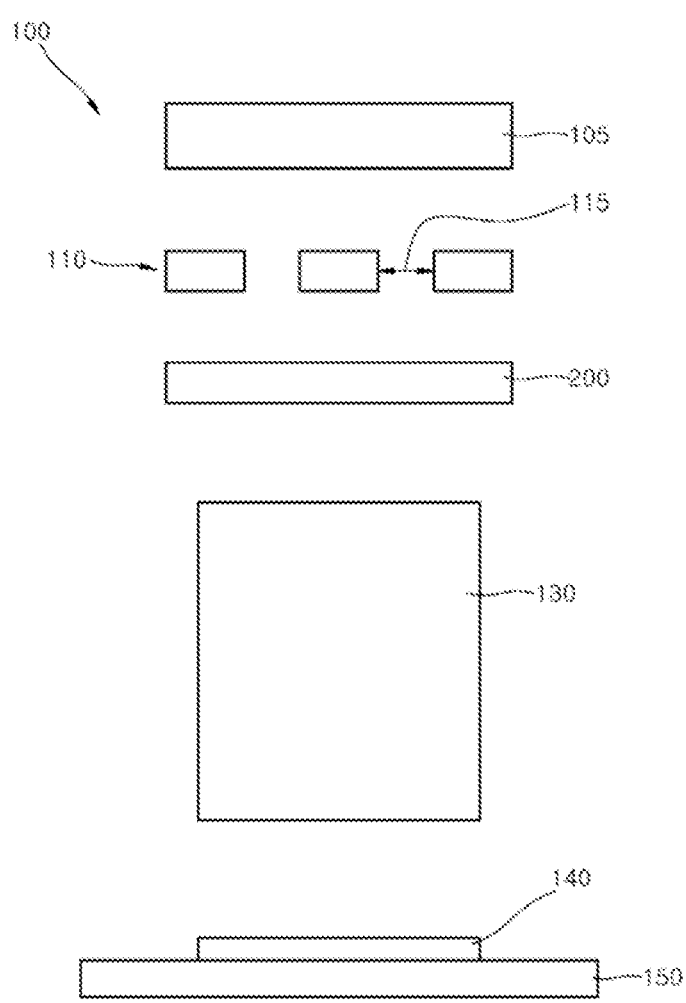
FIG. 1 is a schematic view illustrating an exposure equipment used in a lithography process, according to an embodiment of the present invention.

Example embodiments will be described in more detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

In the following embodiments, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, a thicknesses and length of components are exaggerated compared to actual physical thickness and intervals for convenience of illustration. The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a schematic view illustrating an exposure equipment (100) used in a lithography process according to an embodiment of the present invention.

Referring to FIG. 1, the exposure equipment 100 may be configured to include a light source 105, an illumination system 110, an exposure mask 200, a lens module 130 and a stage 150. A wafer 140 may be loaded onto the stage 150 to perform the lithography process. The exposure mask 200 may include a pattern (not shown) that has substantially the configuration as a target pattern to be formed on the wafer 140. In an embodiment, the pattern of the exposure mask 200 may be fabricated to have a size greater than the size of the target pattern. This may be advantageous in reliably generating a fine size target pattern. In operation, a light generated from the light source 105 may be irradiated onto the exposure mask 200 through one or more apertures 115 of the illumination system 110, and an image generated from the pattern of the exposure mask 200 may be transferred on the wafer 140 through the lens module 130. The image generated from the pattern of the exposure mask 200 may be scaled down by the lens module 130 while it is being transferred onto the wafer 140. As a result, the target pattern is formed on the wafer 140 which corresponds to the pattern of the exposure mask 200 but also has a smaller size than the size of the pattern of the exposure mask.

Meanwhile, a planar area occupied by cell patterns of a semiconductor memory device may be over 50% of an entire planar area of the semiconductor memory device, and sizes of the cell patterns may become more reduced as the integration density of the semiconductor memory device increases. Accordingly, there may be some limitations in forming fine patterns on a wafer with the lithography process. Various techniques may be used to address and overcome the limitations. For example, a resolution enhancement technique may be employed to form fine patterns of semiconductor devices including the semiconductor memory device. Off-axis illumination systems may be employed in the exposure equipment 100 to improve a resolution of the images generated from the patterns of the exposure mask 200. The off-axis illumination systems may improve an efficiency of a first order light using an off-axis incidence light obliquely irradiated onto an exposure mask. The off-axis illumination systems may include, for example, a dipole illumination system, a tilted dipole illumination system and an annular illumination system.

Figure 2A:
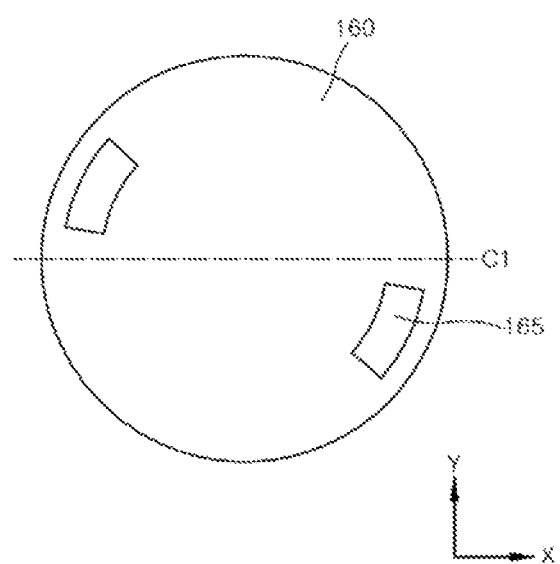
FIGS. 2A-2B and 3 illustrate various illumination systems employed in the exposure equipment of FIG. 1.
Figure 2B:
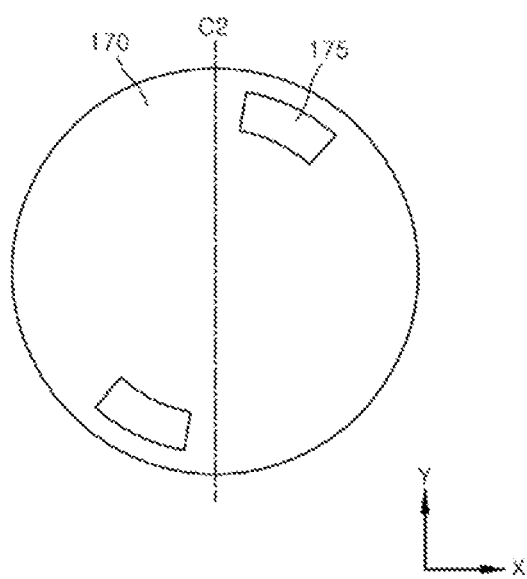
Figure 3:
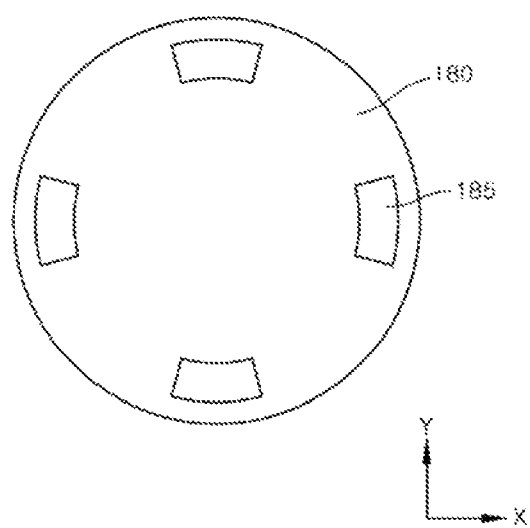

The tilted dipole illumination system may be categorized into an X-tilted dipole illumination system and a Y-tilted dipole illumination system. As illustrated in FIG. 2A, the X-tilted dipole illumination system may be configured to include a light blocking region 160 having a disc shape and a pair of apertures 165 respectively disposed at left and right sides of a central portion of the light blocking region 160, and the pair of apertures 165 may be shifted into a clockwise direction by a predetermined angle so that one of the pair of apertures 165 is located at an upper portion of a horizontal central line C1 and the other of the pair of apertures 165 is located at a lower portion of the horizontal central line C1. The apertures 165 may be positioned at diametrically opposed positions. The horizontal central line C1 may be a straight line that passes over a central point of the light blocking region 160 to be parallel with an X-axis. As illustrated in FIG. 2B, the Y-tilted dipole illumination system may be configured to include a light blocking region 170 and a pair of apertures 175 respectively disposed at top and bottom sides of a central portion of the light blocking region 170, and the pair of apertures 175 may be shifted into a clockwise direction by a predetermined angle so that one of the pair of apertures 175 is located at a right portion of a vertical central line C2 and the other of the pair of apertures 175 is located at a left portion of the vertical central line C2. The vertical central line C2 may be a straight line that passes over a central point of the light blocking region 170 to be parallel with a Y-axis. A quadrupole illumination system may be configured to include a light blocking region 180 and two pairs of apertures positioned at diametrically opposed positions, e.g., four apertures 185 respectively disposed at left, right, top and bottom sides of a central portion of the light blocking region 180, as illustrated in FIG. 3.

The off-axis illumination system may have some advantages in realization of dense patterns. However, in the event that the off-axis illumination system is employed in an exposure equipment to perform an exposure process, the off-axis illumination system may be influenced by an aberration of a lens module of the exposure equipment and may cause a distortion phenomenon resulting in a first distorted target pattern formed on the wafer 140. If a subsequent exposure process is applied to the wafer, for forming a second target pattern above the first distorted target pattern, an overlay accuracy between the second target pattern and the first distorted pattern may be degraded to reduce a fabrication yield of semiconductor devices formed on the wafer. If additional exposure processes are applied to the wafer, an overlay variation may increase to degrade the reliability of the semiconductor device and to cause malfunction of the semiconductor device.

In fabrication of semiconductor devices such as DRAM devices, after an isolation layer is formed in a wafer to define active regions, subsequent processes are performed to form gates, bit lines and contact plugs on the wafer having the isolation layer. In such a case, if a pattern distortion phenomenon occurs at an exposure process for forming the isolation layer, it may be difficult to control overlay accuracies at the subsequent processes for forming the gates, the bit lines and the contact plugs. In particular, the pattern distortion phenomenon at a backend process such as a metallization process may occur more severely due to various process parameters in addition to the numerical aperture of the lens module of the exposure equipment. Thus, it may be difficult to find out the causes of the pattern distortion phenomenon. Accordingly, in the event that the exposure process for forming the isolation layer is performed using an off-axis illumination system such as a tilted dipole illumination system, it may be important to accurately analyze the pattern distortion phenomenon caused by the numerical aperture of the lens module and to find out methods of compensating for the pattern distortion.

Figure 4:
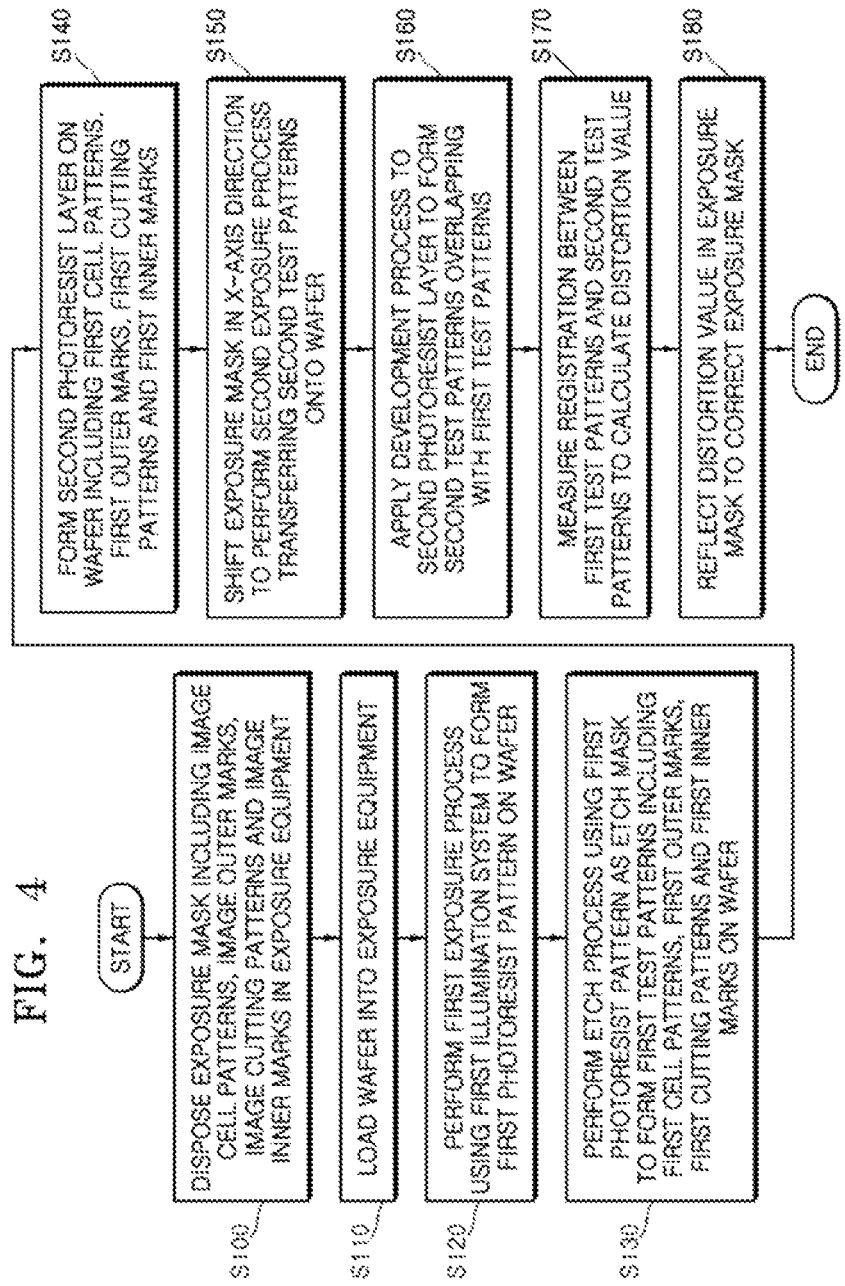
FIG. 4 is a process flowchart illustrating a method of controlling distortion of an exposure process according to an embodiment of the present invention.

FIG. 4 is a process flowchart illustrating a method of controlling distortion of an exposure process according to an embodiment of the present invention. FIGS. 5 to 8 illustrate an exemplary exposure mask according to an embodiment of the present invention. FIGS. 9 to 15 are schematic diagrams illustrating a method of controlling distortion of an exposure process according to an embodiment of the present invention, and FIGS. 16A to 18B are graphs illustrating distortion values of an exposure process.

Figure 5:
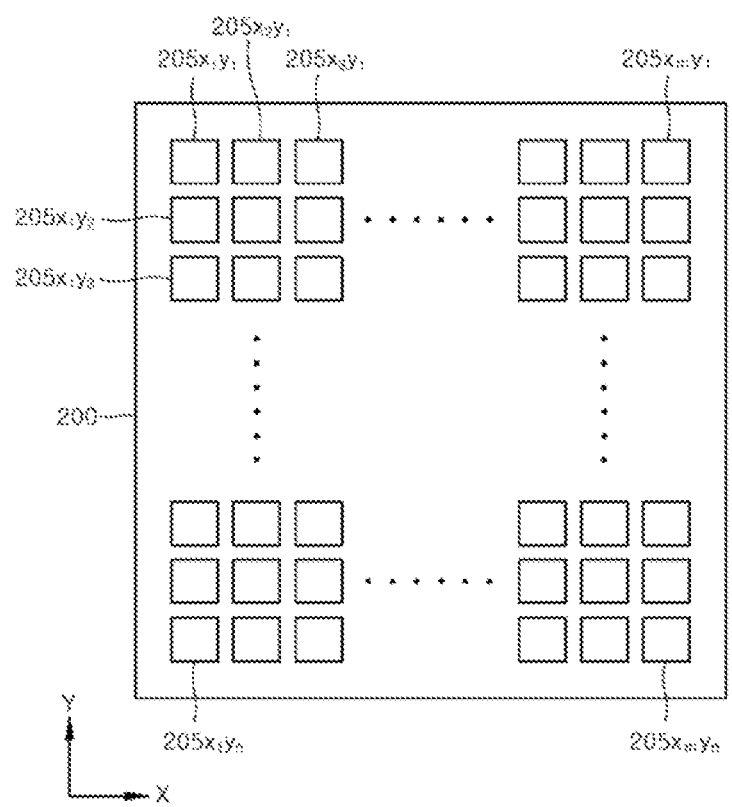
FIGS. 5 to 8 illustrate an exemplary exposure mask according to an embodiment of the present invention.
Figure 6:
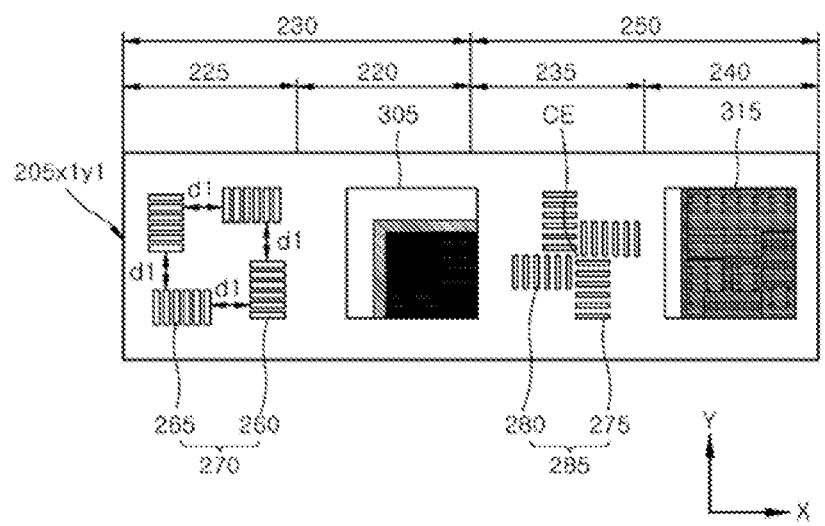

Referring to FIGS. 4 to 6, the exposure mask 200 may be disposed or loaded in the exposure equipment 100 of FIG. 1 (see step S100). The exposure mask 200 may include image cell patterns, image outer marks, image cutting patterns, and image inner marks. Die regions $205_{x1y1}$ to $205_{xmyn}$ may be arrayed in a matrix form on the exposure mask 200 and spaced apart from each other in an X-axis direction and in a Y-axis direction, respectively, wherein, "m" and "n" denote natural numbers which are equal to or greater than two. For example, in an embodiment, as an example, "m" may be fifty and "n" may be twenty four, meaning that, the die regions $205_{x1y1}$ to $205_{x50y24}$ are disposed at cross points of 24 rows and 50 columns.

FIG. 6 is an enlarged view of an exemplary die region $205_{x1y1}$ among the die regions $205_{x1y1}$ to $205_{xmyn}$ illustrated in FIG. 5.

Referring to FIG. 6, the die region $205_{x1y1}$ may include a first exposure region 230 and a second exposure region 250. The first and second exposure regions 230 and 250 may be disposed to be adjacent to each other in the X-axis direction.

The first exposure region 230 may be divided into a first image region 220 and a first alignment key region 225. The first image region 220 and the first alignment key region 225 may be arrayed in an opposite direction to the X-axis direction. The first image region 220 may include an image pattern 305, for example, an active line pattern, which are designed to be transferred to a wafer during a lithography process. The first alignment key region 225 may include an overlay image outer mark 270 indicating an alignment accuracy between the image pattern formed in a previous exposure process and an image pattern formed in a current exposure process.

For example, as illustrated in FIG. 6 the image pattern 305 may be an image cell pattern.

The second image region 240 may include an image pattern 315. The second alignment key region 235 may include an overlay image inner mark 285.

Figure 7:
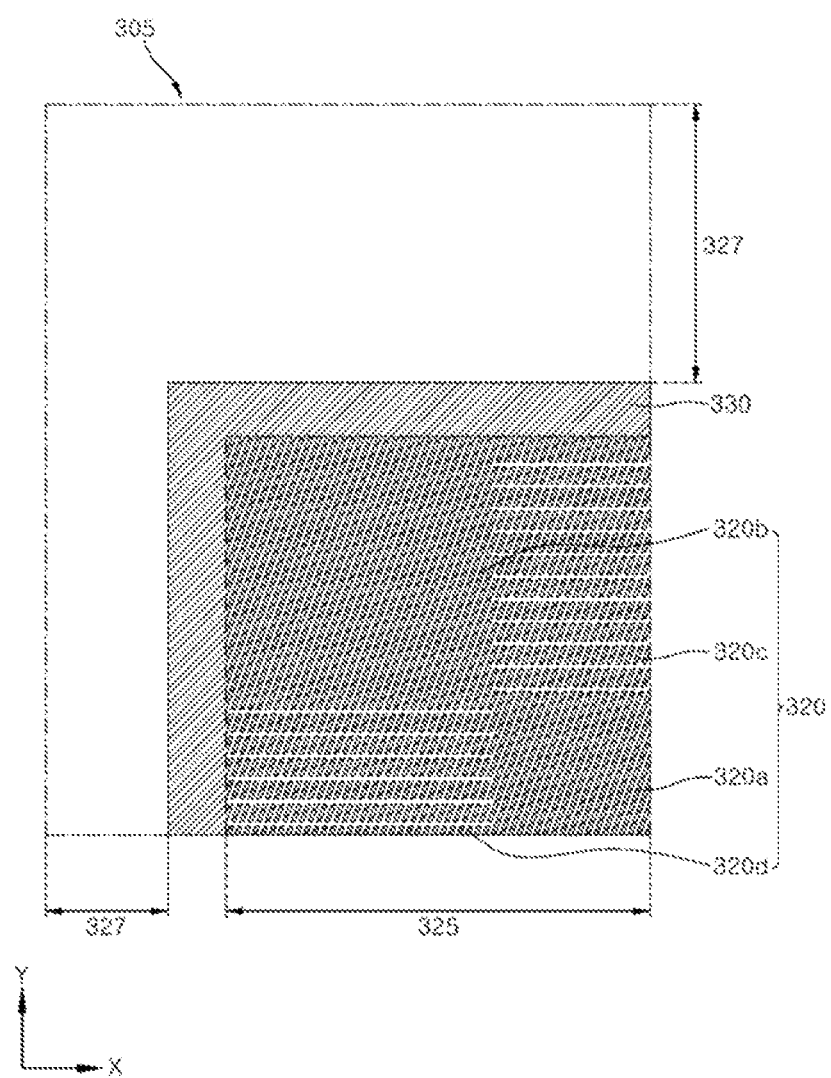

FIG. 7 is an enlarged view illustrating a portion of the image cell pattern 305.

Referring to FIG. 7, the image cell pattern 305 may include a first region 325 and a second region 327 surrounding the first region 325. The first and second regions 325 and 327 may be separated from each other by a guide pattern 330.

Active line patterns 320 may be disposed in the first region 325 of the image cell pattern 305. The active line patterns 320 may be designed to extend in a first sloping direction between the X-axis direction and the Y-axis direction. The active line patterns 320 may include first line patterns 320a, second line patterns 320b, third line patterns 320c and fourth line patterns 320d. The second line patterns 320b may be disposed in a corner region of the first region 325, and the third line patterns 320c may be disposed at a right side of the second line patterns 320b along the X-axis direction. In addition, the first line patterns 320a may be disposed at a bottom side of the third line patterns 320c along the Y-axis direction, and the fourth line patterns 320d may be disposed at a left side of the first line patterns 320a along the X-axis direction.

In other words, the first line patterns 320a may extend in a first sloping direction between the X-axis direction and the Y-axis direction. The second line patterns 320b may extend in the first sloping direction, and be disposed in a region adjacent to the first line patterns 320a in a second sloping direction intersecting the first sloping direction. The third line patterns 320c may extend in the first sloping direction, and be disposed in a region adjacent to the first line patterns 320a in the Y-axis direction and adjacent to the second line patterns 320b in the X-axis direction. The fourth line patterns 320d may extend in the first sloping direction, and be disposed in a region adjacent to the second line patterns 320b in an opposite direction to the Y-axis direction and adjacent to the first line patterns 320a in the opposite direction to the X-axis direction. Each pattern of the third and fourth line patterns 320c and 320d may have a length relatively less than that of each pattern of the first and second line patterns 320a and 320b.

The guide pattern 330 which is disposed between the first and second regions 325 and 327 may surround the first region 325. The guide pattern 330 may have a rectangular closed loop shape in a plan view. The active line patterns 320 may have the same shape as line-shaped cell partition patterns used for a spacer patterning technique for defining active regions which are disposed in a wafer.

Referring again to FIG. 6, an overlay image outer mark 270 may be disposed in the first alignment key region 225. The overlay image outer mark 270 may include first patterns 260 and second patterns 265. The first patterns 260 may extend in a first direction, for example, in the X-axis direction of the die region $205_{x1y1}$ and may be arrayed in a second direction intersecting the first direction, for example, in the Y-axis direction. The second patterns 265 may extend in the second direction (i.e., in the Y-axis direction) and may be arrayed in the first direction (i.e., in the X-axis direction). The first patterns 260 may be arrayed to provide a plurality of line and space features. The second patterns 265 may also be arrayed to provide a plurality of line and space features. The group of the first patterns 260 may be disposed to be spaced apart from a group of the second patterns 265 by a predetermined distance d1 along the X-axis direction or the Y-axis direction.

The second exposure region 250 may be divided into a second image region 240 and a second alignment key region 235. The second exposure region 250 and the first exposure region 230 may be disposed side by side. The second image region 240 and the second alignment key region 235 may be arrayed in the opposite direction to the X-axis direction. The second image region 240 may include image patterns, for example, hole patterns, which are designed to be transferred to a wafer during a lithography process. The second alignment key region 235 may include an overlay mark indicating an alignment accuracy between an image pattern formed in a previous exposure and an image pattern formed in a current exposure.

Specifically, the second image region 240 may include an image cutting pattern 315.

Figure 8:
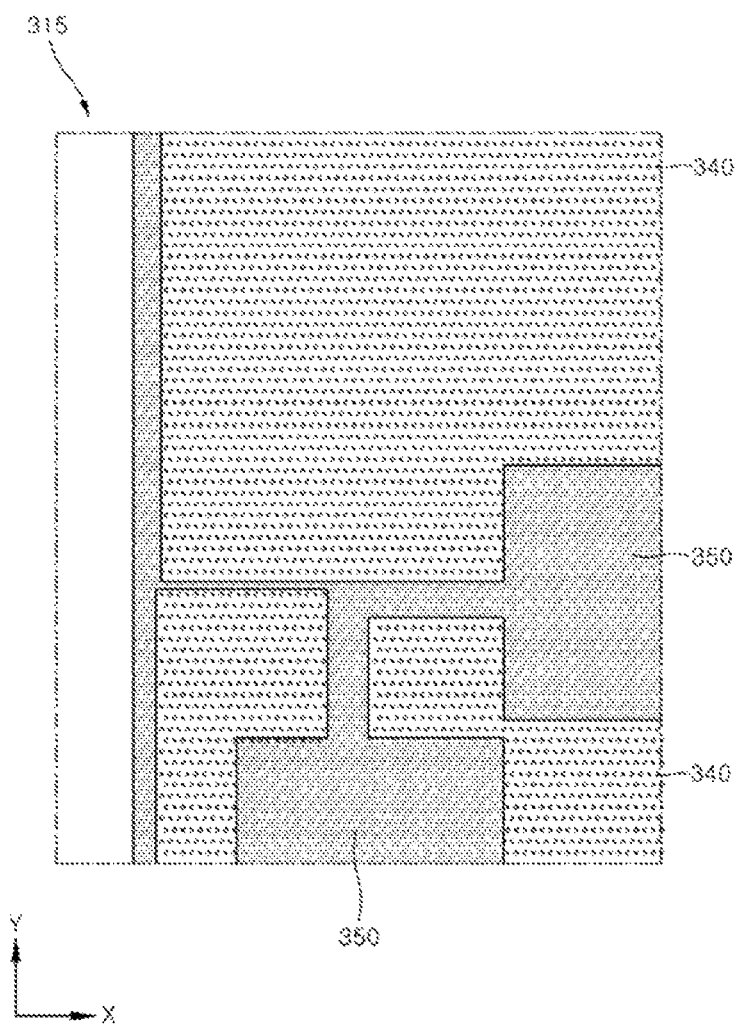

FIG. 8 is an enlarged view illustrating a portion of the image cutting pattern 315.

Referring to FIG. 8, the image cutting pattern 315 may include hole patterns 340 and block patterns 350. Each of the hole patterns 340 may have a circular shape, and the hole patterns 340 may be arrayed in the X-axis direction and in the Y-axis direction. The hole patterns 340 disposed in two adjacent rows may be arrayed in a zigzag type along the X-axis direction. The block patterns 350 may be designed to be a polygon-shaped plate pattern and may be disposed to cover a region in which no hole pattern is arrayed. The image cutting pattern 315 may be transferred to a wafer during a second exposure to overlap with the active line patterns 320 which are formed by transferring the image cell pattern 305 to the wafer during a first exposure (refer to descriptions of step S150 of FIG. 4 and descriptions of FIG. 15). That is, the hole patterns 340 of the image cutting pattern 315 may be transferred to the wafer having the active line patterns 320 formed by the first exposure, while the second exposure is performed. In such a case, the hole patterns 340 may be transferred to predetermined portions of the active line patterns 320 in some desired regions to selectively cut the active line patterns 320 in a subsequent process. As a result, patterns corresponding to active regions may be formed on the wafer, and an isolation region may be defined by the patterns. While the hole patterns 340 are transferred, the block patterns 350 may be transferred to regions in which the active line patterns 320 should not be cut.

Referring again to FIG. 6, an overlay image inner mark 285 may be disposed in the second alignment key region 235. The overlay image inner mark 285 may include third patterns 275 and fourth patterns 280. The third patterns 275 may extend in the first direction of the die region $205_{x1y1}$ and, for example, in the X-axis direction and may be arrayed in the second direction intersecting the first direction, for example, in the Y-axis direction. The fourth patterns 280 may extend in the second direction (i.e., in the Y-axis direction) and may be arrayed in the first direction (i.e., in the X-axis direction). The third patterns 275 may be arrayed to provide a line/space feature. The fourth patterns 280 may also be arrayed to provide a line/space feature. The third and fourth patterns 275 and 280 may be disposed to be close to each other and to be adjacent to a central portion CE of the overlay image inner mark 285. An accuracy of the distortion values of the image patterns such as the image cell pattern 305 and the image cutting pattern 315 formed on a wafer may increase as the number of the overlay image outer mark 270 and the overlay image inner mark 285 for measuring a registration value between the image cell pattern 305 and the image cutting pattern 315 increases. Thus, in an embodiment, the exposure mask 200 may be designed so that at least one (e.g., the die region $205_{x1y1}$) of the die regions $205_{x1y1}$ to $205_{xmyn}$ includes at least one image cell pattern 305, at least one overlay image outer mark 270, at least one image cutting pattern 315, and at least one overlay image inner mark 285. The number of the overlay image outer marks 270 may be equal to the number of image cell patterns 305. Also, the number of the overlay image inner marks 285 may be equal to the number of image cutting patterns 315. A sufficient number of the overlay image outer marks 270 and a sufficient number of the overlay image inner marks 285 are transferred to the wafer to improve the accuracy of the distortion values extracted from overlay values between the image cell patterns 305 and the image cutting patterns 315 which are formed throughout the wafer. Each of the remaining die regions $205_{x2y1}$ to $205_{xmyn}$ may also have the same configuration as the die region $205_{x1y1}$ described above.

After the exposure mask 200 having the aforementioned configuration is loaded into the exposure equipment 100, the wafer 140 may also be loaded into the exposure equipment 100 (see step S110 of FIG. 4) and the wafer 140 is aligned with the exposure mask 200. The wafer 140 may be a semiconductor wafer such as, for example, a silicon wafer. A first photoresist layer (not shown) may be coated on the wafer 140. The first photoresist layer may be coated on the wafer 140, before the wafer 140 is loaded into the exposure equipment 100. The first photoresist layer may be formed of a positive-type photoresist material.

Figure 9:
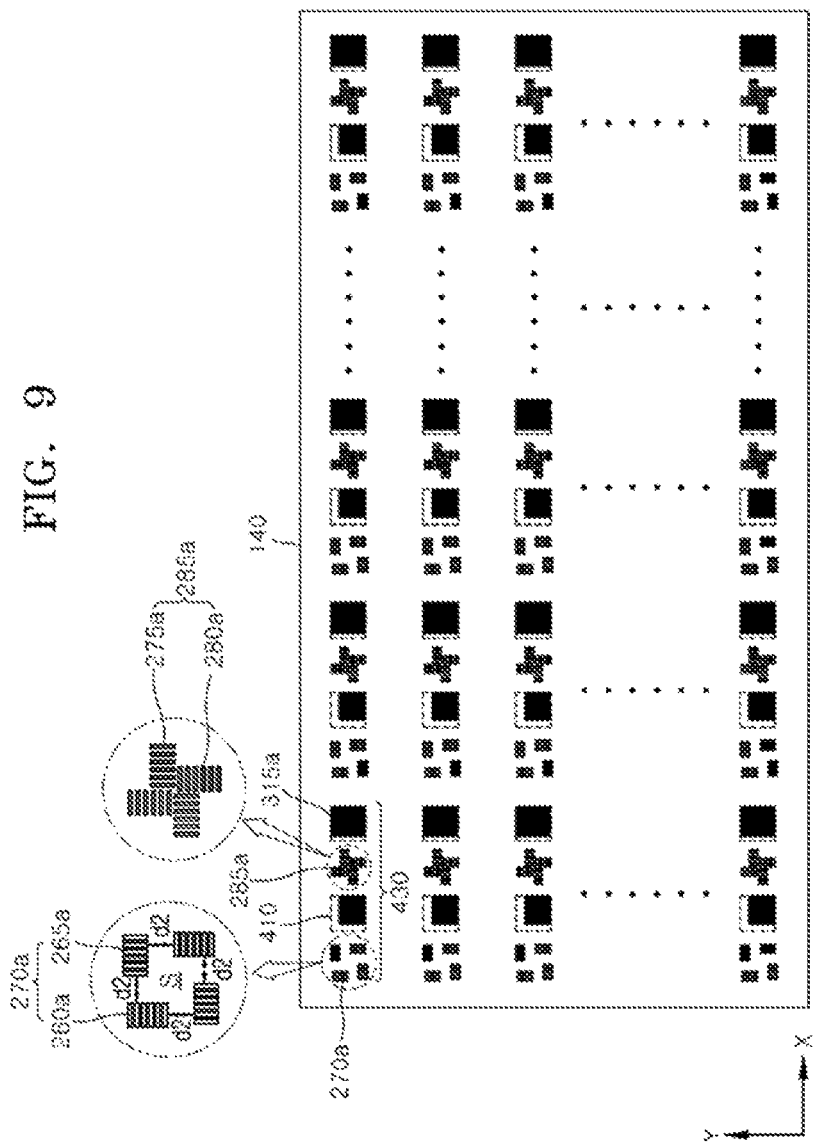
FIGS. 9 to 15 are schematic diagrams illustrating a method of controlling distortion of an exposure process according to an embodiment of the present invention.

Referring to FIGS. 4 and 9, a first exposure using a first illumination system may be applied to the first photoresist layer to form a first photoresist pattern (not shown) on the wafer 140 (see step S120 of FIG. 4). The first exposure may be performed using an off-axis illumination system as the illumination system (110 of FIG. 1) to irradiate an oblique incidence light onto the exposure mask 200. In an embodiment, the off-axis illumination system used in the first exposure may correspond to the tilted dipole illumination system illustrated in FIGS. 2A and 2B. When the first exposure is performed, the various patterns disposed in the first and second exposure regions (refer to 230 and 250 of FIG. 6) of the die regions $205_{x1y1}$ to $205_{xmyn}$ included in the exposure mask 200 may be transferred to the first photoresist layer coated on the wafer 140. Specifically, while the first exposure is performed, the image cell patterns 305 disposed in the first image regions 220 of the first exposure regions 230 and overlay image outer marks 270 disposed in the first alignment key regions 225 of the first exposure regions 230 may be transferred to the first photoresist layer. In addition, while the first exposure is performed, the image cutting patterns 315 disposed in the second image regions 240 of the second exposure regions 250 and overlay image inner marks 285 disposed in the second alignment key regions 235 of the second exposure regions 250 may also be transferred to the first photoresist layer. Subsequently, a first development may be performed on the first photoresist layer exposed by the first exposure, thereby removing unnecessary portions of the first photoresist layer. As a result of the first exposure and development, a first photoresist pattern (not shown) may be formed on the wafer 140. The first photoresist pattern may be formed to include various patterns corresponding to the image cell patterns 305, the overlay image outer marks 270, the image cutting patterns 315 and the overlay image inner marks 285.

Subsequently, the wafer 140 may be etched by an etch process employing the first photoresist pattern as an etch mask (see step S130 of FIG. 4). As a result of the etch process, a plurality of first test patterns 430 may be formed on the wafer 140 to be arrayed in the X-axis direction and in the Y-axis direction, as illustrated in FIG. 9. Each of the first test patterns 430 may be formed to include a first cell pattern 410, a first outer mark 270a, a first cutting pattern 315a and a first inner mark 285a.

Figure 10:
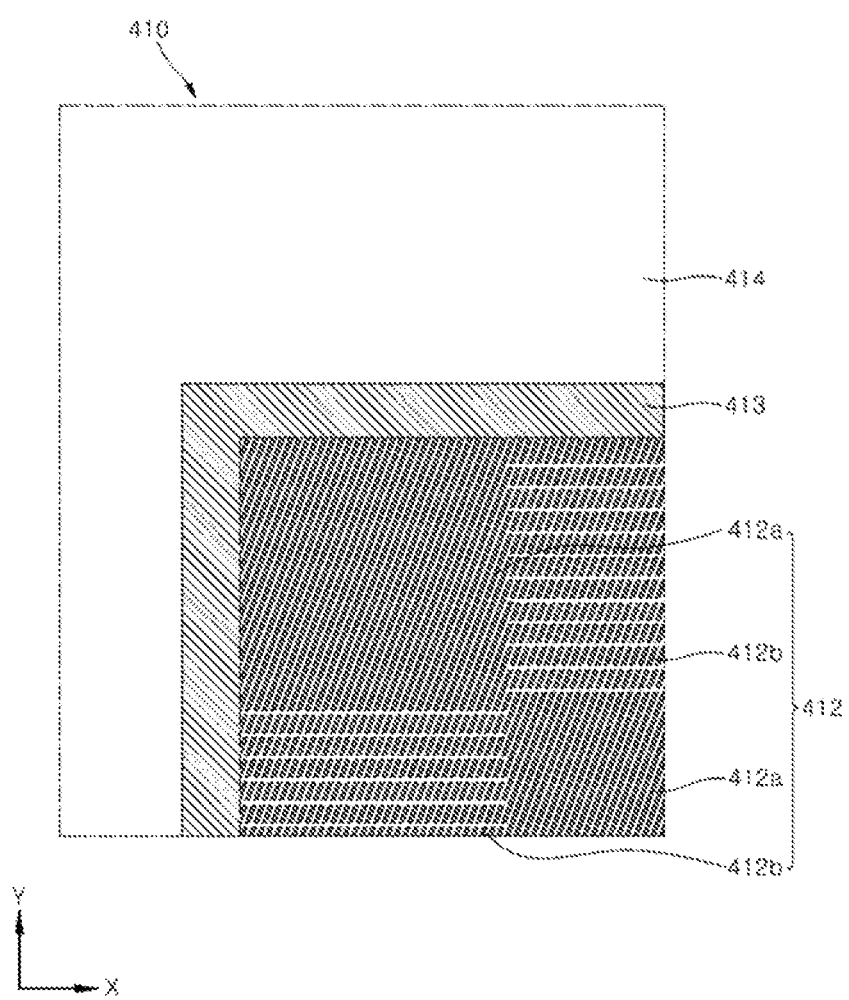

FIG. 10 is an enlarged view of the first cell pattern 410.

Referring to FIG. 10, the first cell pattern 410 may include partition patterns 412, a guide pattern 413 and a first space portion 414.

The partition patterns 412 of the first cell pattern 410 may be formed to have the same features and pitch as cell partition patterns used for a spacer patterning technique for defining active regions. Thus, the partition patterns 412 may be line patterns extending in a first sloping direction between the X-axis direction and the Y-axis direction. The partition patterns 412 may be arrayed to be spaced apart from each other by a predetermined distance in a second sloping direction intersecting the first sloping direction.

The partition patterns 412 may be formed to have the same features and pitch as the first, second, third and fourth line patterns 320a, 320b, 320c and 320d constituting the active line patterns (320 of FIG. 7). The partition patterns 412 may include first partition patterns 412a and second partition patterns 412b. The first and second partition patterns 412a and 412b may be formed to extend in the first sloping direction. Each of the first partition patterns 412a may have a length that is relatively greater than that of the of the second partition patterns 412b. The guide pattern 413 may be formed between a region in which the partition patterns 412 are formed and the first space portion 414. Thus, the partition patterns 412 may be separated from the first space portion 414 by the guide pattern 413. In an embodiment, the guide pattern 413 may surround the partition patterns 412 and may have a rectangular closed loop shape in a plan view.

Referring to FIG. 9, the first outer mark 270a may be formed on the wafer 140 to be adjacent to the first cell pattern 410. Since the first outer marks 270a are disposed to correspond to the first cell patterns 410 in a ratio of 1:1, the number of the first outer marks 270a formed on the wafer 140 may be equal to the number of the first cell patterns 410. In an embodiment, when the first cell patterns 410 are formed to be located at cross points of twenty four rows (parallel with the X-axis) and fifty columns (parallel with the Y-axis), the first outer marks 270a may also be formed at cross points of twenty four rows (parallel with the X-axis) and fifty columns (parallel with the Y-axis). The first outer marks 270a may be formed to have the same features as the image outer marks 270 of the exposure mask 200. For example, referring to an enlarged figure of a first outer mark 270a illustrated in FIG. 9, any one of the first outer marks 270a may include a first outer part 260a including a plurality of patterns arrayed in the Y-axis direction and a second outer part 265a including a plurality of patterns arrayed in the X-axis direction which is intersecting the Y-axis direction. The X and Y directions as shown in FIG. 9 are perpendicular to one another, however, the invention is not limited to such configuration. The patterns of the first outer part 260a may be arrayed to provide a line/space feature. The patterns of the second outer part 265a may also be arrayed to provide a line/space feature. The patterns of the first and second outer parts 260a and 265a may have the same dimensions and pitch. The first outer part 260a of the first outer mark 270a may be disposed to be spaced apart from the second outer part 265a of the first outer mark 270a by a predetermined distance d2 along the X-axis direction or the Y-axis direction. As illustrated in FIG. 9, a first outer mark may include two first outer parts 260a and two second outer parts 265a arranged alternately along the periphery of a square. Thus, an empty space S may be provided at a central portion of the first outer mark 270a.

The first inner mark 285a may be formed to be adjacent to the first cell pattern 410 in the X-axis direction, and the first cutting pattern 315a may be formed to be adjacent to the first inner mark 285a in the X-axis direction.

The first inner mark 285a may be formed to be adjacent to the first cutting pattern 315a. The first inner mark 285a may be formed to have the same feature as the overlay image inner mark 285 of the exposure mask 200. Specifically, referring to an enlarged portion of any one of the overlay image inner marks 285, each of the overlay image inner marks 285 may include a first inner part 275a including a plurality of patterns arrayed in the X-axis direction and a second inner part 280a including a plurality of patterns arrayed in the Y-axis direction. The patterns of the first inner part 275a may be arrayed to provide a line/space feature. The patterns of the second inner part 280a may also be arrayed to provide a plurality of line and space features. The first and second inner parts 275a and 280a may be formed to be close to each other and may be located to be adjacent to a central point of the first inner mark 285a. After the first test patterns 430 are formed on the wafer 140, the first photoresist pattern may be removed.

Figure 11:
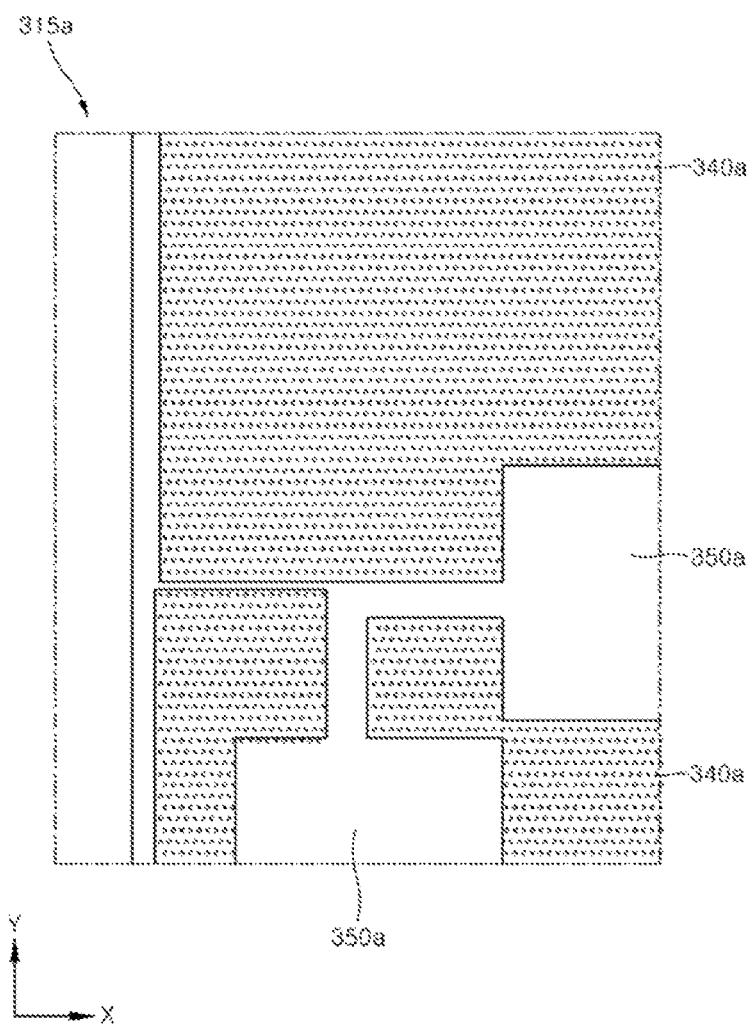

FIG. 11 is an enlarged view illustrating the first cutting pattern 315a.

Referring to FIG. 11, the first cutting pattern 315a may include hole patterns 340a and block patterns 350a. Each of the hole patterns 340a may include a plurality of circular holes (in a plan view), arrayed at a regular interval in a plurality of rows extending in the X-axis direction. The holes in the hole patterns 340a which are disposed in two adjacent rows may be arrayed in a zigzag type along the X-axis direction. The block patterns 350a may be designed to be a polygon-shaped plate pattern disposed to cover a region which has no holes.

Figure 12:
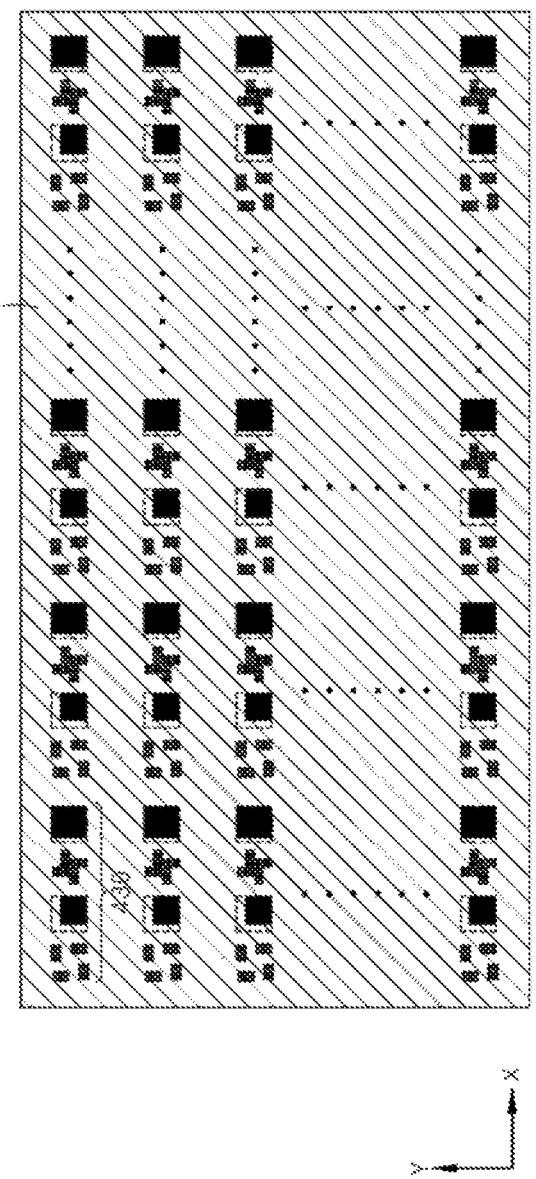

Referring to FIGS. 4 and 12, after the first photoresist pattern is removed, a second photoresist layer 450 may be formed on an entire surface of the wafer 140 including the first test patterns 430 (see step S140 of FIG. 4). The second photoresist layer 450 may be formed of a photoresist material which is different from the first photoresist layer. For example, the second photoresist layer 450 may be formed of a negative-type photoresist material when the first photoresist layer is formed of a positive-type photoresist material. The second photoresist layer 450 may be formed to include a bottom anti-reflect coating (BARC) layer.

Figure 13:
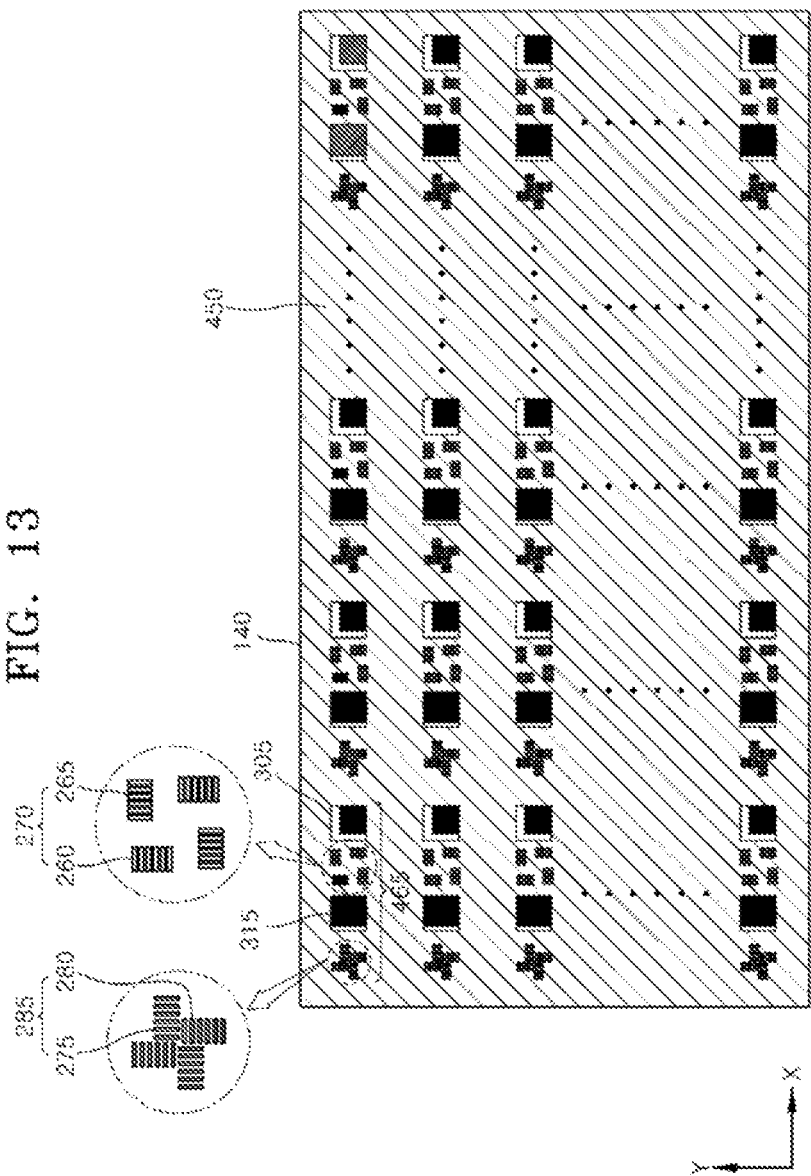
Figure 14:
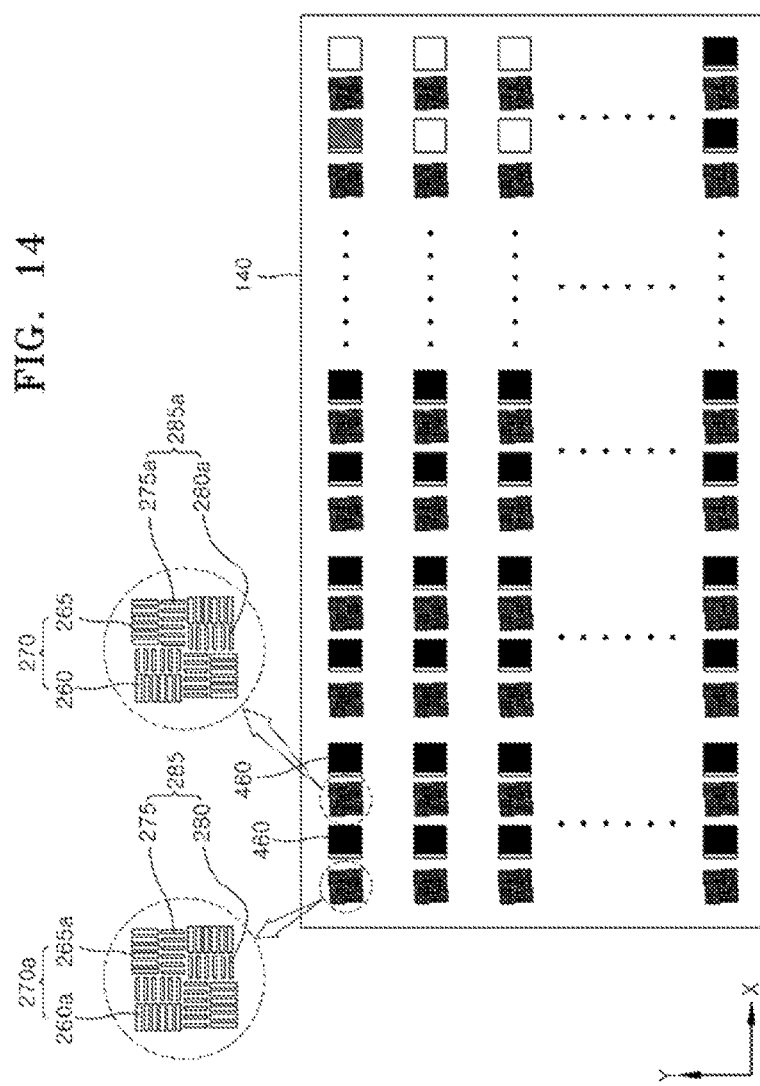

Referring to FIGS. 4 and 13, the exposure mask 200 may be shifted into the X-axis direction to perform a second exposure using a second illumination system to transfer second test patterns 465 to the second photoresist layer 450 (see step S150 of FIG. 4). The second illumination system may be an illumination system which is different from the first illumination system used in the first exposure. In an embodiment, the second exposure may be performed using the quadrupole illumination system illustrated in FIG. 3 as the second illumination system. The second exposure may be performed after the exposure mask 200 used in the first exposure is shifted into the X-axis direction by a predetermined distance. In an embodiment, the second exposure may be performed after the exposure mask 200 used in the first exposure is shifted by a distance that is equal to half of a pitch of the die regions $205_{x1y1}$ to $205_{xmyn}$ in the X-axis direction. For example, when the die regions $205_{x1y1}$ to $205_{xmyn}$ of the exposure mask 200 are arrayed to have a pitch of 400 micrometers (μm) in the X-axis direction, the second exposure may be performed after the exposure mask 200 used in the first exposure is shifted by 200 micrometers (μm) in the X-axis direction. In such a case, the image cutting patterns 315 disposed in the second exposure regions 250 of the shifted exposure mask 200 may be positioned to overlap with the first cell patterns 410 formed on the wafer 140 by the first exposure, and the overlay image inner marks 285 disposed in the second exposure regions 250 of the shifted exposure mask 200 may be positioned to overlap with the first outer marks 270a formed on the wafer 140 by the first exposure. Thus, the overlay image inner mark 285, the image cutting pattern 315, the overlay image outer mark 270 and the image cell pattern 305, which are sequentially arrayed in the X-axis direction in the shifted exposure mask 200, may constitute the second test pattern 465.

As described above, when the second exposure using the second illumination system is performed, the various patterns in the first and second exposure regions 230 and 250 of the die regions $205_{x1y1}$ to $205_{xmyn}$ included in the exposure mask 200 may be shifted into the X-axis direction and may be transferred to the second photoresist layer 450. Thus, any one of the second test patterns 465 composed of a set of the overlay image inner mark 285, the image cutting pattern 315, the overlay image outer mark 270 and the image cell pattern 305, which are sequentially arrayed in FIG. 13, may be transferred to the second photoresist layer 450 to overlap with any one of the first test patterns 430 illustrated in FIG. 9.

Subsequently, referring to FIGS. 4, 11, 14 and 15, a development process may be performed to selectively remove unnecessary portions of the second photoresist layer 450 (see step S160 of FIG. 4). As a result, the second test patterns (465 of FIG. 13) may be formed on the wafer 140 to be spaced apart from each other in the X-axis direction and in the Y-axis direction. The second test patterns (465 of FIG. 13) may be formed to overlap with the first test patterns (430 of FIG. 9), respectively. Specifically, each of the second test patterns 465 comprised of the second photoresist layer 450 may be formed to overlap with any one of the first test patterns 430, which includes the first outer mark 270a, the first cell pattern 410, the first inner mark 285a and the first cutting pattern 315a that are arrayed in the X-axis direction. As described above, each of the second test patterns 465 may include the overlay image inner mark 285, the image cutting pattern 315, the overlay image outer mark 270 and the image cell pattern 305 which are sequentially arrayed in the X-axis direction. Thus, the overlay image inner mark 285 may be transferred to overlap with the empty space S provided at the central portion of the first outer mark 270a formed on the wafer 140, and the overlay image outer mark 270 may be transferred to overlap with an outside region of the first inner mark 285a formed on the wafer 140. In addition, the image cutting pattern 315 may be transferred to overlap with the first cell pattern 410 formed on the wafer 140, and the image cell pattern 305 may be transferred to overlap with the first cutting pattern 315a formed on the wafer 140. The first cell pattern 410 and the image cutting pattern 315 overlapping with each other may constitute an overlap pattern portion 460, and the first cutting pattern 315a and the image cell pattern 305 overlapping with each other may constitute another overlap pattern portion 460.

Active region patterns exposing an isolation region may be formed by the overlap pattern portions 460 in a subsequent process.

Figure 15:
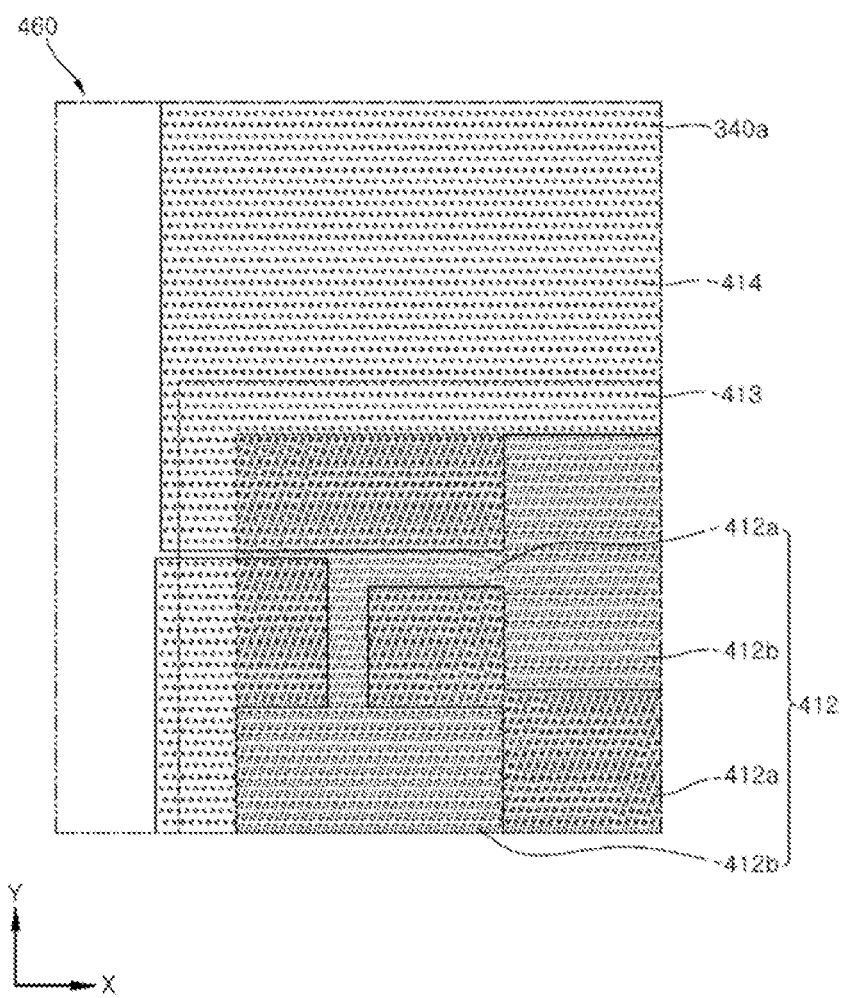

FIG. 15 illustrates an enlarged view of the overlap pattern portion 460.

Referring to FIG. 15, after the second exposure is performed, the hole patterns 340a may be formed to overlap with the first space portion 414 of the first cell pattern (410 of FIG. 10) due to the nature of the negative photoresist material, an exposed region of which is not removed by a developer. Some of the hole patterns 340 and the block patterns 350 included in the image cutting pattern 315 of the second test pattern 465 may be formed to overlap with a region in which the first partition pattern 412a is formed. In addition, the second photoresist layer 450 corresponding to a portion of the block pattern 350 that does not overlap with the first partition pattern 412a may be removed by a developer. Thus, the second partition pattern 412b may be exposed.

Subsequently, registration values between the first test patterns 430 and the second test patterns 465 formed on the wafer 140 may be measured to calculate or extract distortion values (see step S170 of FIG. 4). The registration values may be obtained by measuring error ranges of misalignment between the first outer marks 270a of the first test patterns 430 and the overlay image inner marks 285 of the second test patterns 465 using an overlay measurement equipment (not shown), and the distortion values may be extracted from the registration values. In some other embodiments, the distortion values may be extracted from overlay values between the first cell patterns 410 of the first test patterns 430 and the image cutting patterns 315 of the second test patterns 465.

In an embodiment, an error range of 5 nanometers (nm) from a reference position may be obtained by measuring a distortion value using the first outer mark 270a and the overlay image inner mark 285 overlapping with the first outer mark 270a. When a distortion value is measured using the first cell pattern 410 formed in an actual cell region of the wafer 140, an error range of 3 nanometers (nm) may be obtained. Although an error range is measured as being shifted from a reference position into a leftward direction in the event that a distortion value is measured using the first outer mark 270a and the overlay image inner mark 285, the partition pattern 412 formed in an actual cell region may be shifted into a sloping direction to provide an error range. That is, information on a misalignment value obtained from the alignment keys may mismatch with information on a misalignment value obtained from the actual patterns. Thus, an actual position of the first cell pattern 410 formed on the wafer 140 may be compared with a position of the first cell pattern 410 in a data base used in fabrication of the exposure mask 200 to calculate a distortion value. The second test pattern 465 may be formed on the wafer 140 using the second exposure employing the quadrupole illumination system as the illumination system 110, as described above. Thus, the distortion value of the second test pattern 465 may be neglected. Accordingly, it may be understood that the extracted distortion value may be due to the tilted dipole illumination system used in the first exposure.

Subsequently, the measured distortion values may be analyzed with a modelling technique to extract non-compensating conditions which are not capable of compensating for. The non-compensating conditions may correspond to physically controlling the exposure equipment 100, for example, controlling a slope of the stage 150 included in the exposure equipment 100.

Subsequently, the distortion values extracted or calculated at step S170 may be reflected to correct the exposure mask 200 (see step S180 of FIG. 4). One of methods of correcting the exposure mask 200 is to forcibly correct the positions of the distorted image patterns of the exposure mask 200. For example, a stress layer (not shown) may be formed on a quartz substrate of the exposure mask 200 to compensate for or offset the distortion values. The stress layer may be formed by irradiating a laser beam onto the quartz substrate of the exposure mask 200. Another one of the methods of correcting the exposure mask 200 is to fabricate a new exposure mask by reflecting the distortion values. For example, the distortion values extracted from the exposure mask 200 may be reflected in a step of forming image patterns on a mask substrate with an electron beam, thereby fabricating a corrected exposure mask.

Figure 16A:
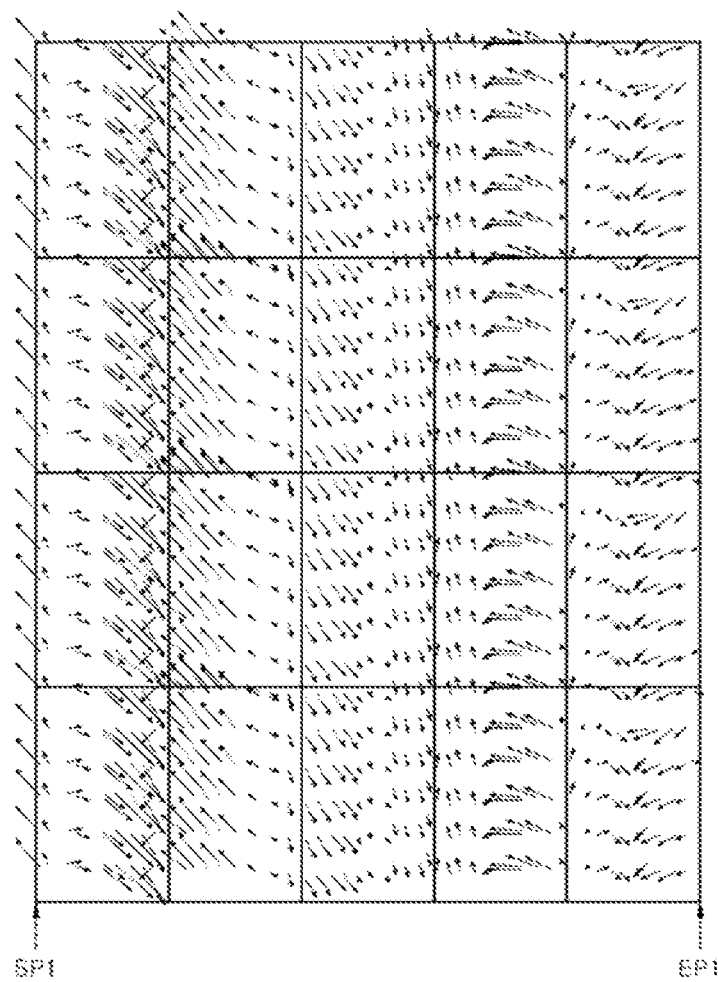
FIGS. 16A-16B, 17 and 18A-18B are registration maps and graphs illustrating distortion values of an exposure process.
Figure 16B:
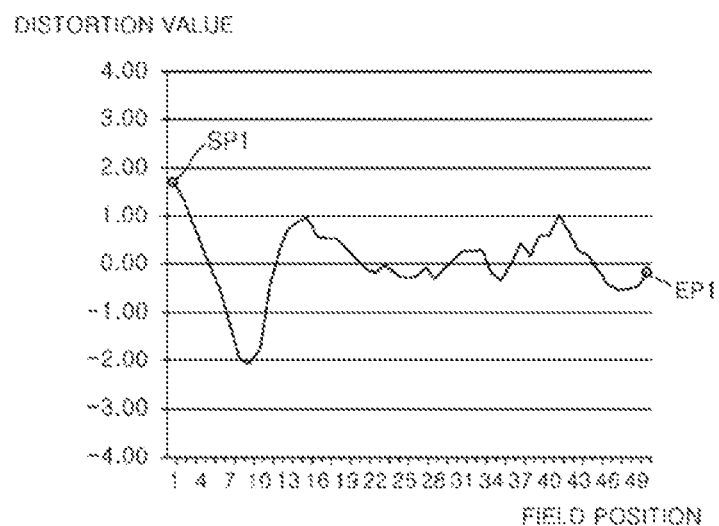
Figure 17:
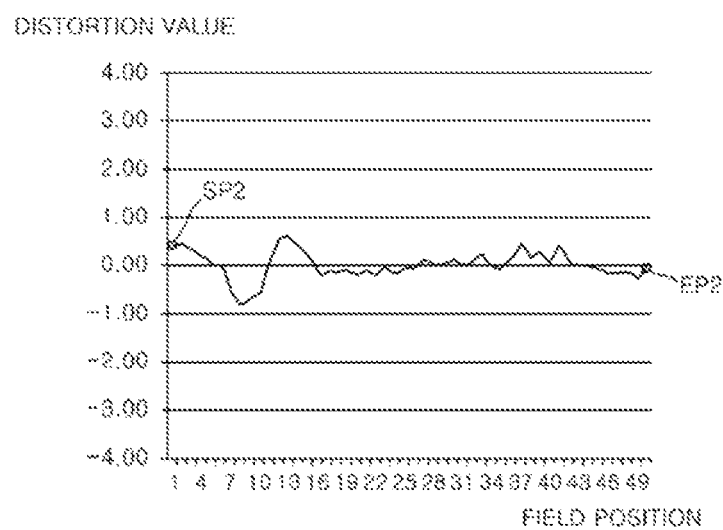
Figure 18A:
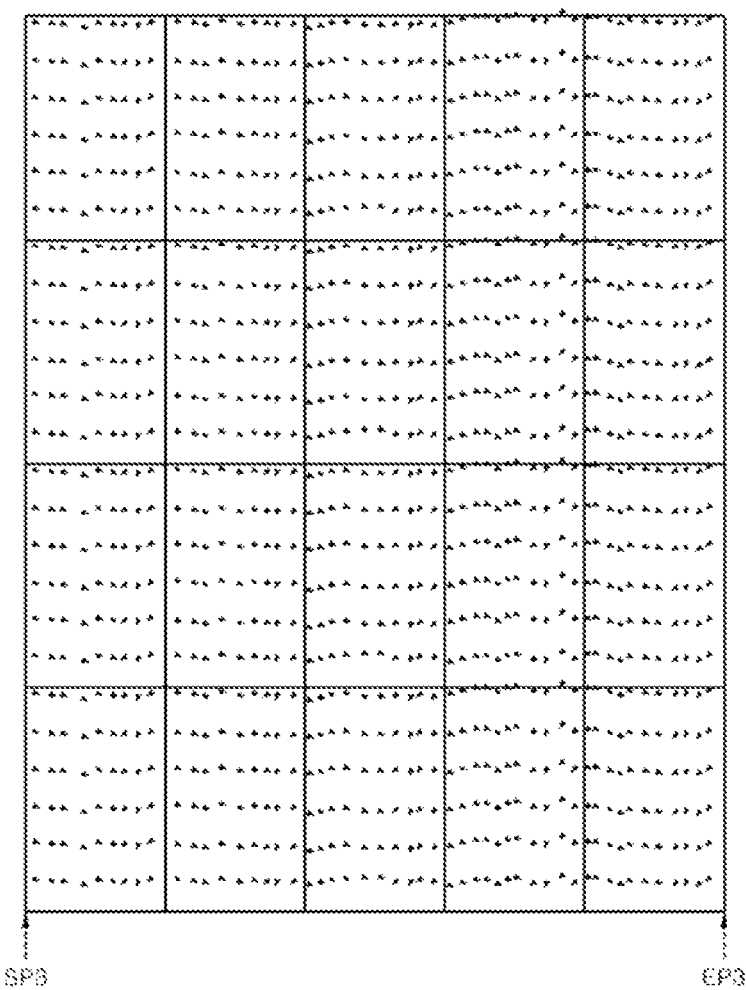
Figure 18B:
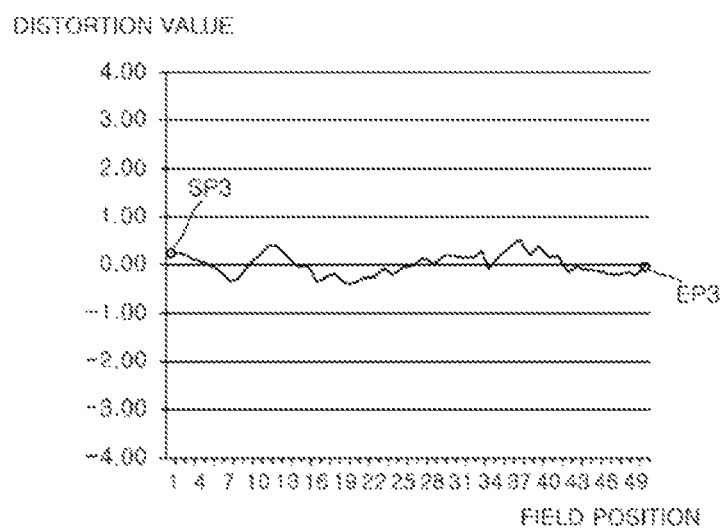

FIG. 16A is a registration map illustrating distortion values extracted or calculated at step S170, and FIG. 16B is a graph illustrating the distortion values of FIG. 16A as a function of a field position. FIG. 17 is a graph illustrating distortion values of an exposure mask corrected by irradiating a laser beam onto a quartz substrate of the exposure mask showing the distortion values of FIG. 16A as a function of field positions of the corrected exposure mask. FIG. 18A is a registration map illustrating distortion values of an exposure mask corrected during a fabrication step of the exposure mask using an electron beam to reflect the distortion values of FIG. 16A, and FIG. 18B is a graph illustrating the distortion values of FIG. 18A as a function of a field position of the corrected exposure mask. The registration values may correspond to measurement values of overlay values between two different layers. The registration map may be illustrated using arrows corresponding to distortion values which are greater than a predetermined registration error tolerance.

Referring to FIGS. 16A and 16B, the distortion values were measured from a start position SP1 to an end position EP1. If no distortion is expressed as a value of zero, most of distortion values greater than one were distributed in a field corresponding to the start position SP1 that the distortion value is initially measured, as well as in some fields adjacent to the start position SP1.

Referring to FIG. 17, all of the distortion values measured from a start position SP2 to an end position EP2 were less than one and converged on zero as the field was close to the end position EP2. In addition, referring to FIGS. 18A and 18B, all of the distortion values measured from a start position SP3 to an end position EP3 were less than one and were uniformly distributed throughout the fields. Accordingly, it may be understood that an exposure mask corrected at the fabrication step of the exposure mask is relatively more excellent than an exposure mask corrected by irradiating a laser beam onto a quartz substrate of the exposure mask.

In conclusion, when the exposure mask 200 for forming active regions is corrected using any one of two correction methods described above, a distortion phenomenon caused by the exposure equipment 100 may be controlled to improve an overlay margin in subsequent processes. Moreover, in fabrication of semiconductor devices, an abnormal distortion phenomenon occurring at an active definition step corresponding to a first exposure step may be analyzed before exposure masks for performing subsequent exposure steps are fabricated. Thus, when the exposure mask 200 has distortion values which are greater than a predetermined registration error tolerance, the exposure mask 200 may be corrected to prevent distortion failures in subsequent exposure processes due to the distortion of the exposure mask 200. As a result, the subsequent exposure processes may be stably performed to improve the fabrication yield of semiconductor devices. In addition, even though the distortion failure is due to the exposure equipment 100, the exposure processes may be stably performed by correcting the exposure mask 200 without any calibration of the exposure equipment 100.

The embodiments of the present disclosure have been disclosed for illustrative purposes. Those skilled in the art to which the present invention pertains will appreciate that various modifications, additions and substitutions are possible, without departing from the scope and spirit of the present disclosure and the accompanying claims.

What is claimed is:

1. A method of controlling distortion of an exposure, the method comprising:
    aligning an exposure mask with a wafer, wherein the exposure mask includes at least one first image pattern, at least one overlay image outer mark, at least one second image pattern having a feature different from the first image pattern, and at least one overlay image inner mark;
    forming a first test pattern on the wafer using a first exposure with the exposure mask and a first illumination system;
    forming a photoresist layer on an entire surface of the wafer including the first test pattern;
    performing a second exposure with the exposure mask and a second illumination system different from the first illumination system to form a second test pattern overlapping with the first test pattern, wherein the second image pattern and the overlay image inner mark of the exposure mask are transferred to the photoresist layer to overlap with the first test pattern during the second exposure;
    extracting a distortion value between the first test pattern and the second test pattern; and
    correcting the exposure mask or fabricating a corrected exposure mask using the distortion value.

2. The method of claim 1,
    wherein the first illumination system includes a tilted dipole illumination system; and
    wherein the second illumination system includes a quadrupole illumination system.

3. The method of claim 1, wherein the exposure mask includes a first exposure region and a second exposure region which are arrayed in a first direction;
    wherein the first exposure region includes a first image region and a first alignment key region which are arrayed in an opposite direction to the first direction;
    wherein the second exposure region includes a second image region and a second alignment key region which are arrayed in the opposite direction to the first direction;
    wherein an image cell pattern corresponding to the first image pattern is disposed in the first image region of the first exposure region;
    wherein the image outer mark is disposed in the first alignment key region of the first exposure region;

wherein an image cutting pattern corresponding to the second image pattern is disposed in the second image region of the second exposure region; and wherein the image inner mark is disposed in the second alignment key region of the second exposure region.

4. The method of claim 3,
wherein the image cell pattern includes active line patterns;
wherein the active line patterns have the same configuration as line-shaped cell partition patterns for defining active regions;
wherein the image cutting pattern includes hole patterns and block patterns; and
wherein the hole patterns act as cutting pattern for isolating the active line patterns.

5. The method of claim 4,
wherein each of the hole patterns includes a plurality if circular holes;
wherein the holes are arrayed in the first direction and in a second direction intersecting the first direction;
wherein the holes disposed in two adjacent rows parallel with the first direction are arrayed in a zigzag type along the first direction; and
wherein the block patterns are disposed to cover a region in which the hole patterns are not arrayed.

6. The method of claim 4, wherein the active line patterns include:
first line patterns extending in a first sloping direction between the first direction and a second direction intersecting the first direction;
second line patterns extending in the first sloping direction, and disposed in a region adjacent to the first line patterns in a second sloping direction intersecting the first sloping direction;
third line patterns extending in the first sloping direction, and disposed in a region adjacent to the first line patterns in the second direction and adjacent to the second line patterns in the first direction; and
fourth line patterns extending in the first sloping direction, and disposed in a region adjacent to the second line patterns in an opposite direction to the second direction and adjacent to the first line patterns in the opposite direction to the first direction.

7. The method of claim 6, wherein each pattern of the third and fourth line patterns has a length relatively less than that of each pattern of the first and second line patterns.

8. The method of claim 1,
wherein the number of the image outer marks is equal to the number of the first image patterns; and
wherein the number of the image inner marks is equal to the number of the second image patterns.

9. The method of claim 1,
wherein the image outer mark includes first patterns arrayed in a second direction and second patterns arrayed in a first direction perpendicular to the second direction; and
wherein a group of the first patterns is disposed to be spaced apart from a group of the second patterns in the first direction or the second direction by a predetermined distance.

10. The method of claim 9,
wherein the first patterns are arrayed to provide a line/space shape; and wherein the second patterns are arrayed to provide a line/space shape.

11. The method of claim 1,
wherein the image inner mark includes third patterns arrayed in a second direction and fourth patterns arrayed in a first direction perpendicular to the second direction; and
wherein a group of the third patterns and a group of the fourth patterns are disposed to be adjacent to a central point of the image inner mark.

12. The method of claim 1, wherein the forming the first test pattern on the wafer includes:
forming a first photoresist layer on the wafer;
transferring the at least one first image pattern, the at least one second image pattern, the at least one image outer mark and the at least one image inner mark of the exposure mask to the first photoresist layer to form an exposed first photoresist layer; and
developing the exposed first photoresist layer to form a first photoresist pattern;
etching the wafer using the first photoresist pattern as an etch mask to form the first test pattern; and
removing the first photoresist pattern.

13. The method of claim 1, wherein the extracting the distortion value includes:
measuring a misalignment value of the first outer mark transferred during the second exposure with an overlay measurement equipment.

14. The method of claim 1, wherein the extracting the distortion value includes:
comparing a position of the first test pattern formed on the wafer with a position corresponding to the first test pattern in a data base used in fabrication of the exposure mask to calculate a distortion value.

15. The method of claim 1, wherein the photoresist layer is formed of a negative-type photoresist material.

16. The method of claim 1, wherein the second exposure is performed after the exposure mask used in the first exposure is shifted by a predetermined distance in a first direction.

17. The method of claim 15,
wherein the image outer mark, the first image pattern, the image inner mark and the second image pattern are arrayed in a first direction to constitute a single die region; and
wherein the predetermined distance is a half pitch of the die region in the first direction.

18. The method of claim 1, wherein the correcting the exposure mask includes:
irradiating a laser beam onto a substrate of the exposure mask to form a stress layer generating a stress for compensating for the distortion value.

19. The method of claim 1, wherein the fabricating the corrected exposure mask includes:
reflecting the distortion value in a step of forming image patterns on a mask substrate with an electron beam.

20. The method of claim 1, wherein the correcting the exposure mask includes:
forming a stress layer generating a stress for compensating for the distortion value on a quartz substrate of the exposure mask.

* * * * *